(12) United States Patent
Kim et al.

(10) Patent No.: US 7,468,582 B2
(45) Date of Patent: Dec. 23, 2008

(54) PLASMA DISPLAY PANEL AND PLASMA DISPLAY DEVICE HAVING THE SAME

(75) Inventors: Sok-San Kim, Cheonan-si (KR); In-Soo Cho, Seongnam-si (KR)

(73) Assignee: Samsung SDI Co., Ltd., Suwon (KR)

( * ) Notice: Subject to any disclaimer, the term of this patent is extended or adjusted under 35 U.S.C. 154(b) by 782 days.

(21) Appl. No.: 10/958,554

(22) Filed: Oct. 6, 2004

(65) Prior Publication Data

US 2005/0077822 A1 Apr. 14, 2005

(30) Foreign Application Priority Data

Oct. 9, 2003 (KR) .................. 10-2003-0070269

(51) Int. Cl.
*H01J 7/24* (2006.01)
*H01J 17/28* (2006.01)
(52) U.S. Cl. .................. 313/582; 313/587; 313/46
(58) Field of Classification Search ......... 313/582–587, 313/46; 315/169.4; 361/688, 690, 692, 693, 361/697, 678, 752, 708
See application file for complete search history.

(56) References Cited

U.S. PATENT DOCUMENTS 5,831,374 A * 11/1998 Morita et al. ............... 313/46

6,517,744 B1 * 2/2003 Hara et al. .................. 252/506

FOREIGN PATENT DOCUMENTS

KR 2002029201 A * 4/2002
KR 1020050034202 A1 4/2005

OTHER PUBLICATIONS

Machine translation of KR 2002029201 is included.*

* cited by examiner

*Primary Examiner*—Sikha Roy
*Assistant Examiner*—Anthony T Perry
(74) *Attorney, Agent, or Firm*—H.C. Park & Associates, PLC

(57) ABSTRACT

A plasma display panel having improved heat transfer efficiency and temperature distribution, and a plasma display device including the same are disclosed. The plasma display device includes a plasma display module that includes a plasma display panel on which an image is displayed, a chassis base facing the plasma display panel, a circuit unit disposed at a back side of the chassis base for driving the plasma display panel, a front cover and a back cover that house the plasma display module, and at least a heat radiation coating layer formed between the front cover and the back cover. The heat radiation layer reduces a conventional heat dissipation sheet unnecessary, and thus reduces process times and manufacturing costs.

17 Claims, 8 Drawing Sheets

PLASMA DISPLAY PANEL AND PLASMA DISPLAY DEVICE HAVING THE SAME

This application claims priority to Korean Patent Application No. 2003-70269, filed on Oct. 9, 2003, in the Korean Intellectual Property Office, the disclosure of which is herein incorporated by reference in its entirety.

BACKGROUND OF THE INVENTION

1. Field of the Invention

The present invention relates to a plasma display device, and more particularly, to a plasma display device with a structure that facilitates heat radiation from a circuit device.

2. Description of the Related Art

A plasma display device (PDD) is a flat panel display device for displaying pictures by using a discharge effect. Because of its very good performance and characteristics such as high display capacity, high brightness, high contrast, clear latent image, and large viewing angle, and it is thin with a large screen size, the PDD may replace cathode ray tube (CRT) display devices.

In a plasma display device, the discharge used to display images on the plasma display panel (hereinafter also referred to as a "panel") generates a large amount of heat. The heat generated is not distributed on a surface of the panel uniformly but is distributed unevenly according to operating conditions such as strength of discharge, thereby creating different temperature gradients on the surface of the panel.

Conventional plasma display devices include a heat dissipation sheet between the plasma display panel and a chassis base attached to a back side of the plasma display panel. The heat generated by the plasma display panel is transferred to the chassis base via the heat dissipation sheet, and then dissipated to the outside.

However, since the heat dissipation sheet generally has a low thermal conductivity such as a thermal conductivity coefficient of approximately 1 W/mK, heat generated by the plasma display panel may not be rapidly transferred to the chassis base. Consequently, heat transfer efficiency is reduced.

Also, since conventional heat dissipation sheets have low thermal conductivity, the heat radiation in a plane direction is restricted, and this results in a sectional temperature increase on the panel. Accordingly, the light emission efficiency of heated discharge cells may be reduced. As a result, a bright latent image, that is, a brightness difference between cells, may occur, thereby reducing the panel's overall brightness.

In an attempt to solve this problem, a high thermal conductivity heat dissipation sheet is sometimes used. However, the high thermal conductivity heat dissipation sheet is hard to attach to and detach from the panel.

SUMMARY OF THE INVENTION

The present invention provides a plasma display device having an improved structure that can enhance heat transfer efficiency of a plasma display panel.

The present invention also provides a plasma display device that may achieve an efficient heat transfer without mounting an additional heat dissipation means between the plasma display panel and a chassis base.

The present invention also provides a plasma display device that may prevent heat-induced generation of latent images or reduced brightness by rapidly removing uneven temperature gradients on a plane of the plasma display panel.

The present invention also provides a plasma display device that may efficiently dissipate heat generated by other electrical devices on the plasma display panel without using an additional heat dissipator.

The present invention further provides a plasma display device having an improved heat dissipation structure that may make the plasma display device easy to modify or maintain.

According to an aspect of the present invention, there is provided a plasma display device having a plasma display module that includes a plasma display panel on which an image is displayed, a chassis base facing the plasma display panel, and a circuit unit disposed at a back side of the chassis base for driving the plasma display panel, a front cover and a back cover that house the plasma display module therebetween. The plasma display panel also has at least a heat radiation coating layer that includes a ceramic material, having emissivity of at least 0.9, and which is formed between the front cover and the back cover.

The heat radiation coating layer may include alumina and silica.

The heat radiation coating layer may be formed by coating a ceramic paint.

The heat radiation coating layer may be transparent for transmitting light and may be formed on a surface of the plasma display panel facing the front cover.

The heat radiation coating layer may be formed on a surface of the plasma display panel facing the chassis base. At this time, the heat radiation coating layer may be formed with a low brightness color for improving contrast.

The heat radiation coating layer may be formed on at least a surface of both surfaces of the chassis base.

The heat radiation coating layer may be formed on a surface of the circuit unit.

The heat radiation coating layer may be formed on at least a surfaces of both surfaces of the back cover.

According to another aspect of the present invention, there is provided a plasma display module having a plasma display panel on which an image is displayed, a chassis base facing the plasma display panel, and at least a heat radiation coating layer disposed between the plasma display panel and the chassis base. The heat radiation coating may include at least a ceramic material having an emissivity of at least 0.9.

The heat radiation coating layer may be formed on at least a surface on surfaces forming external shape of the plasma display panel.

The heat radiation coating layer may be formed on at least a surface of both surfaces of the chassis base.

According to another aspect of the present invention, there is provided a plasma display panel that includes a front panel, a rear panel combined with the front panel, and a heat radiation coating layer including at least a ceramic material, having emissivity of at least 0.9, formed on at least a surface of a front surface of the front panel and a back surface of the rear panel.

BRIEF DESCRIPTION OF THE DRAWINGS

The above and other features and advantages of the present invention will become more apparent by describing in detail exemplary embodiments thereof with reference to the attached drawings.

DETAILED DESCRIPTION OF THE INVENTION

Hereinafter, the present invention will be described more fully with reference to the accompanying drawings in which embodiments of the invention are shown.

Figure 1:
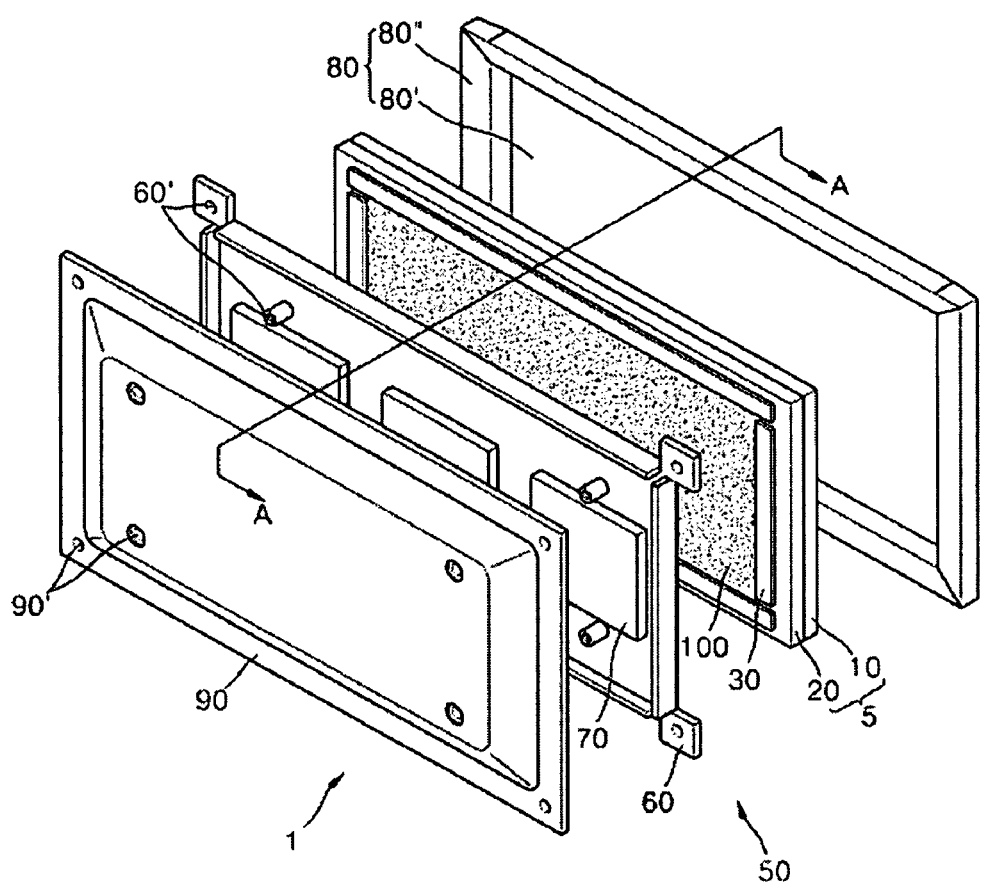
FIG. 1 is an exploded perspective view of a plasma display device according to an embodiment of the present invention.
Figure 2:
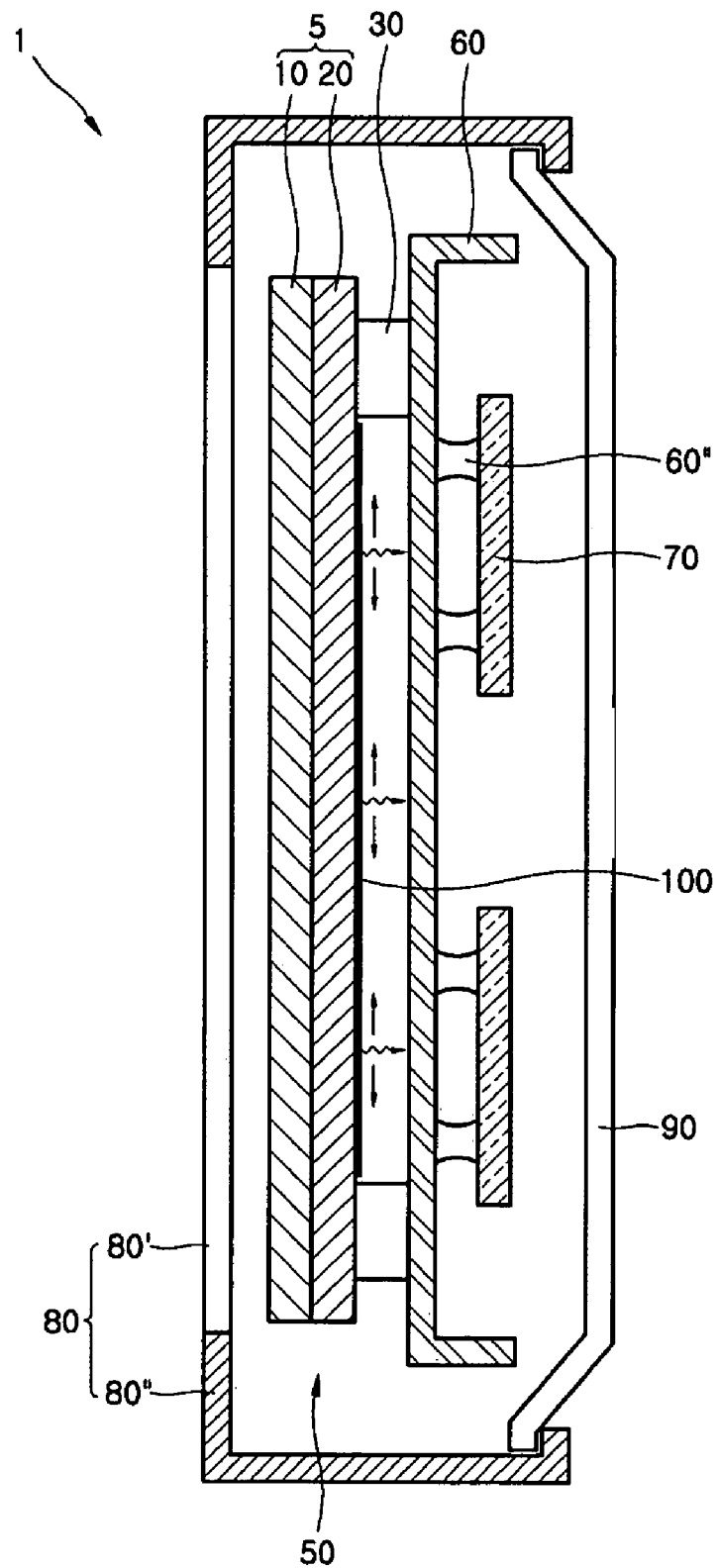
FIG. 2 is a cross-sectional view taken along line A-A in FIG. 1.

FIG. 1 is an exploded perspective view of a plasma display device according to an embodiment of the present invention. FIG. 2 is a cross-sectional view taken along line A-A in FIG. 1. FIGS. 3 through 6 are cross-sectional views of plasma display devices according to different embodiments of the present invention.

Referring to FIGS. 1 and 2, a plasma display device 1 includes a plasma display module 50, a front cover 80 and a back cover 90 that house the plasma display module 50.

The plasma display module 50 includes a plasma display panel 5, a chassis base 60, and a circuit unit 70 disposed on a back side of the chassis base 60.

The plasma display panel 5 includes a front panel 10 and a rear panel 20 in a combined state. The plasma display panel 5, which may be formed of glass, becomes an image display unit using the gas discharge phenomenon. A double sided tape 30 may be attached along a rim of a back side of the plasma display panel 5. The double sided tape 30 attaches the plasma display panel 5 to the chassis base 60.

Since the chassis base 60 may function as a heat sink for dissipating heat generated by the plasma display panel 5 and the circuit unit 70, the chassis base 60 may be formed of a high thermal conductivity material such as aluminum, and manufactured by die casting. A plurality of fixing brackets 60' are included on corners and back side of the chassis base 60. The chassis base 60 is combined with the back cover 90 using a fastening device (not shown), such as screws, by fixing the fastener to the fixed brackets 60' through through-holes 90' formed on the back cover 90.

One or more circuit units 70 may be formed on a back side of the chassis base 60. As depicted in FIG. 2, for this purpose, bosses 60" are formed on a back side of the chassis base 60. The circuit unit 70 may include circuit substrates, such as a common circuit substrate, a power circuit substrate, and a digital circuit substrate, for driving the plasma display panel 5, and various circuit devices are loaded on the circuit substrates.

The plasma display module 50 may be sealed by the front cover 80 and the back cover 90. Here, the front cover 80 and the back cover 90 perform a shielding role. The front cover 80 includes a rim unit 80" and a filter unit 80'. The filter unit 80' may include a reinforced glass (not shown) fixed on the rim unit 80" and an electromagnetic wave shielding layer (not shown) for shielding electromagnetic interference (EMI). The rim unit 80" of the front cover 80 and the back cover 90 may be formed of a high thermal conductivity material such as aluminum.

In a plasma display device 1 structured as above descriptions, according to an aspect of the present invention, a heat radiation coating layer 100 for promoting heat radiation may be formed between the front cover 80 and the back cover 90.

As depicted in FIG. 1, according to an embodiment of the present invention, the heat radiation coating layer 100 may be formed on a back side of the plasma display panel 5. As shown, the plasma display panel 5 and the chassis base 60 may be combined by the double sided tape 30 that surrounds the heat radiation coating layer 100. As depicted in FIG. 2, a space may be formed between the heat radiation coating layer 100 and the chassis base 60 when they are joined together.

The heat radiation coating layer 100 may be a functional thin film including ceramic material, and the ceramic material may include, but is not limited to, an oxide ceramic, a nitride ceramic, and a carbonized ceramic. When the heat radiation coating layer 100 is formed of CERACα(Oki Electric Industry Co., Ltd.), which is a liquid ceramic paint, the heat radiation coating layer 100 may be formed of mixed components such as alumina and silica and a material that increases the emission of far infrared rays.

When the heat radiation coating layer 100 is formed of a material having high emissivity as described above, heat dissipation by radiation is promoted. Emissivity may denote a ratio of heat radiation between the black body and an object at the same temperature, where the emissivity of a black body is assumed to be 1. High emissivity means high radiation energy. According to the Kirchhoff s law, emissivity and absorption rate are quantitatively equal, therefore, high emissivity means heat absorption in an amount that approximately equals the amount of emission.

When the heat radiation coating layer 100 is formed of CERACα, the emissivity is 0.96 at temperature of 100° C., e.g., the emissivity approximates that of a black body.

As described above, by forming a heat radiation coating layer 100 having high emissivity on a back side of the plasma display panel 5, as depicted in FIG. 2, the heat generated by the plasma display panel 5 may be radiated to the chassis base 60 through the heat radiation coating layer 100 as radiation energy, that is, as a far infrared ray with a long wavelength.

The heat radiation coating layer 100 may have a high thermal conductivity. For example, when the heat radiation coating layer 100 is formed of $Al_2O_3$, AlN, SiC, and BeO, the thermal conductivities are about 20 W/mK to 30 W/mK, 70 W/mK to 260 W/mK, 270 W/mK, and 90 W/mK to 250 W/mK, respectively.

Therefore, when an uneven temperature gradient is formed on the plasma display panel 5 due to different discharge strength of the cells for expressing grey scale, as depicted in FIG. 2, the temperature gradient on the plasma display panel 5 may be rapidly removed by promoting heat transfer in a plane direction through the high thermal conductivity heat radiation coating layer 100.

As described above, the heat radiation coating layer 100 may be formed of a ceramic material. A ceramic has high thermal resistance and a low thermal expansion coefficient, and can resist more than 1000° C. Therefore, a heat radiation coating layer 100 formed of a ceramic may maintain tight contact with the plasma display panel 5 without peeling caused by a thermal coefficient difference between the plasma display panel 5 and the heat radiation coating layer 100. In most cases the ceramic will remain bonded to the plasma display panel 5 even if the temperature of the plasma display panel 5 increases.

Also, since the effect of temperature to the thermal conductivity of the ceramic materials is small, the heat radiation coating layer 100 formed of a ceramic material may well function as a heat distribution layer even if the temperature of the plasma display panel 5 increases.

The heat radiation coating layer 100 may be formed with a variety of colors. For example, a heat radiation coating layer 100 formed with a low brightness color may absorb reflected light by the plasma display panel 5, thereby increasing contrast.

It is preferable that the heat radiation coating layer 100 may be formed by drying a coating of a liquid ceramic paint. The ceramic paint may be dried at a lower temperature than the melting point of the plasma display panel 5. The painting process may be performed in the course of manufacturing the plasma display panel 5 or may be performed after manufacturing the plasma display panel 5.

Alternatively, the heat radiation coating layer 100 may be formed by depositing a heat radiation material on a back side of the plasma display panel 5.

Also, the heat radiation coating layer 100 may be formed by ion plating a heat radiation material on the back surface of the plasma display panel 5. The ion plating method is a process of forming a layer such that vapor of the heat radiation material evaporated in a vacuum state is attached to a cathode of a body by ionization in a plasma layer.

As described above, following advantages may be achieved by forming the heat radiation coating layer 100 in a plasma display device 1.

An additional heat dissipation sheet is unnecessary because the heat generated by the plasma display panel 5 may be transferred by radiating through the heat radiation coating layer 100. Accordingly, time and costs for preparing a heat dissipation sheet and attaching the same can be reduced, and a slim and light plasma display device 1 can be manufactured by reducing number of parts in the plasma display device 1.

Also, an overall heat transfer efficiency may be improved because the heat radiation coating layer 100 is formed of a functional material having high emissivity.

Moreover, a plasma display panel 5 with uniform heat distribution may be achieved since heat transfer in the plane direction is promoted through the high thermal conductivity heat radiation coating layer 100. Accordingly, occurrence of a latent image may be reduced or removed, and a crack of the plasma display panel 5 formed of glass may be prevented, thereby increasing lifetime.

Figure 3:
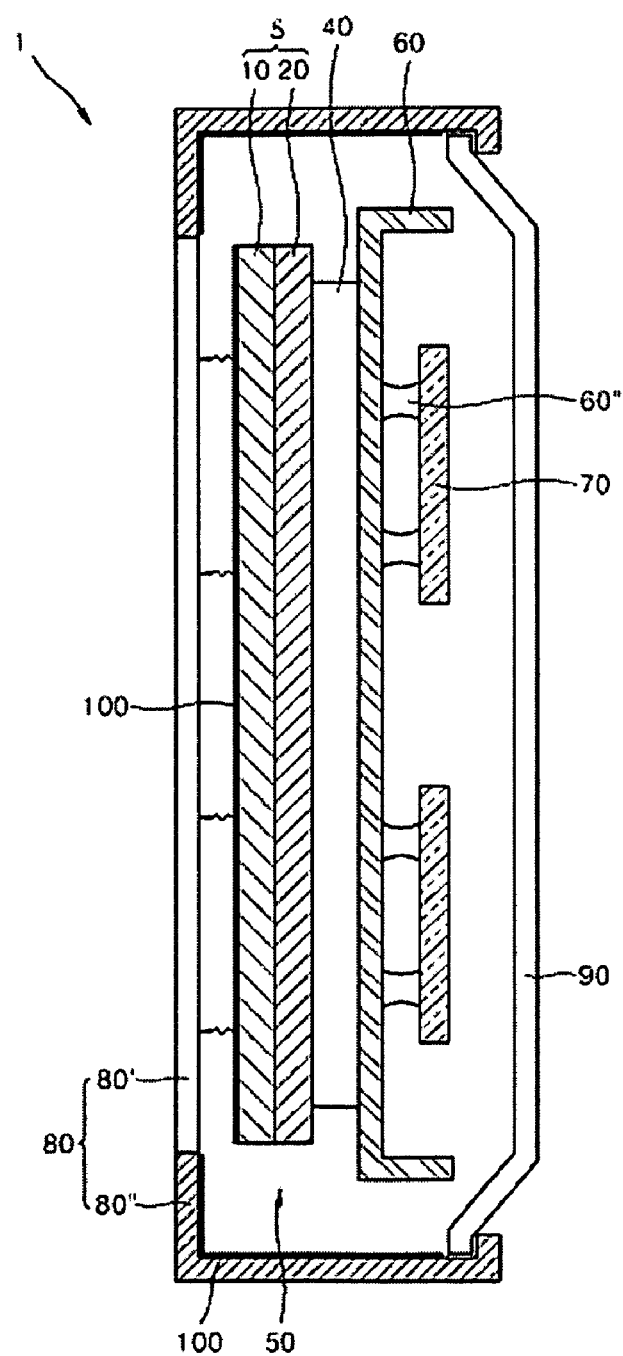
FIGS. 3-6 are cross-sectional views of plasma display devices according to different embodiments of the present invention.

As depicted in FIG. 3, the heat radiation coating layer 100 may also be formed on a front face of the plasma display panel 5. In this embodiment, the heat radiation coating layer 100 may be formed of a transparent material for transmitting visible light generated from the plasma display panel 5.

Also, as depicted in FIG. 3, the rim unit 80" of the front cover 80 may be formed of a high thermal conductivity material and inner surfaces of the rim unit 80" may be coated by a heat radiation coating layer 100 for promoting heat radiation through the front face of the plasma display panel 5. The heat radiation coating layer 100 formed on the rim unit 80" of the front cover 80 rapidly absorbs the radiation heat from the front face of the plasma display panel 5 because of high absorption rate of the heat radiation coating layer 100.

As depicted in FIG. 3, heat transfer efficiency may be increased remarkably when dissipating heat through the chassis base 60 attached to the back side of the plasma display panel and additionally radiating heat through the heat radiation coating layer 100 formed on the front face of the plasma display panel 5. As depicted in FIG. 3, for dissipating heat through the chassis base 60, a heat dissipation sheet 40 may be interposed between the plasma display panel 5 and the chassis base 60. Also, as described above, dissipation of heat radiation may be achieved by forming a heat radiation coating layer 100 on a front surface of the plasma display panel 5.

The heat radiation coating layer 100 formed on the front face of the plasma display panel 5 may perform electromagnetic shielding because a heat radiation coating layer 100 having electrical conductivity may also perform as EMI shielding function.

Figure 4:
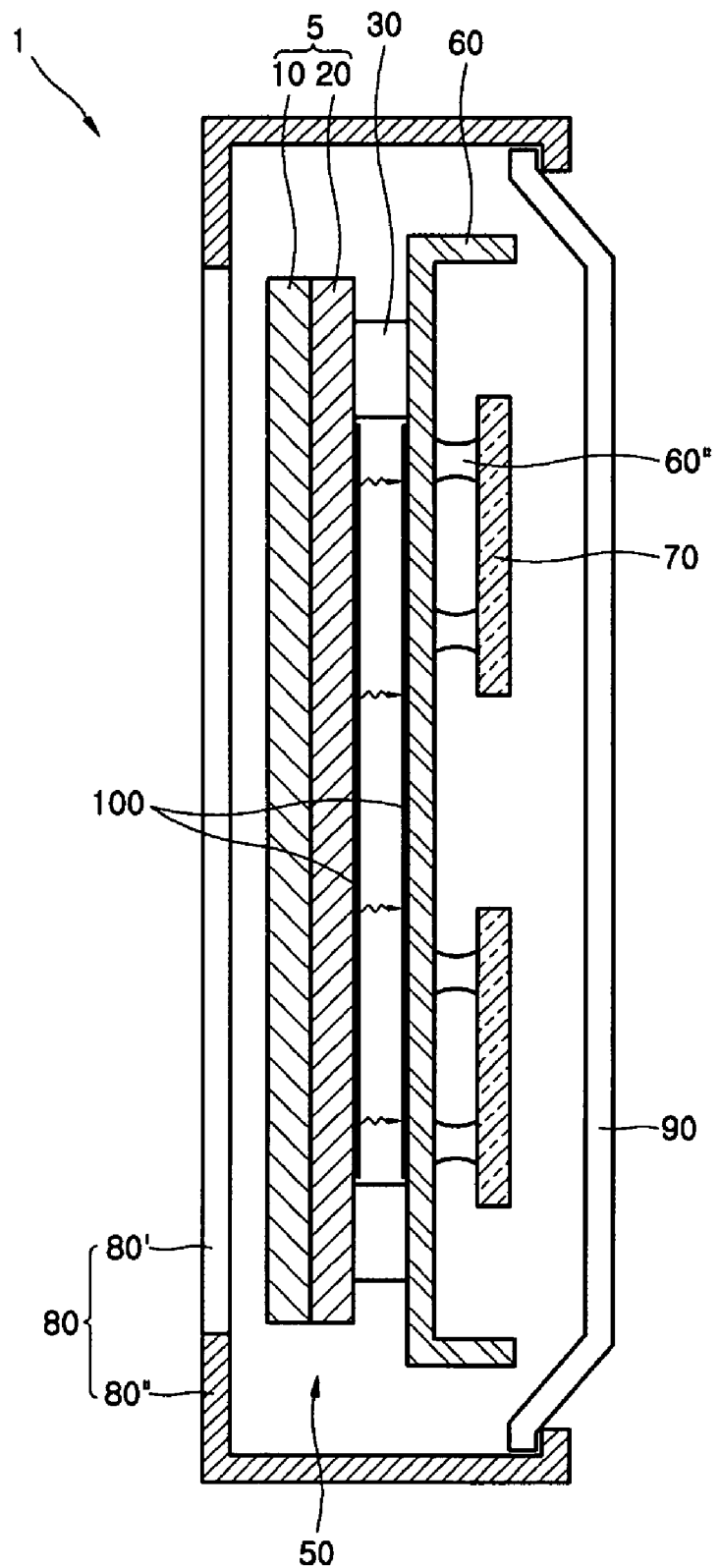

FIG. 4 is a cross-sectional view of another plasma display device according to an embodiment of the invention. As shown in FIG. 4, the heat radiation coating layer 100 may also be disposed in front of the chassis base 60, that is, on a surface opposite to the plasma display panel 5. As depicted in FIG. 4, by forming a high emissivity heat radiation coating layer 100 on the front of the chassis base 60, heat energy emitted in the form of radiation from the plasma display panel 5 may be rapidly absorbed by the heat radiation coating layer 100 and transferred to the chassis base 60. In this case, if a heat radiation coating layer 100 is also formed on a back side of the plasma display panel 5, more efficient heat dissipation can be achieved since the heat radiation coating layer 100 formed on back side of the plasma display panel 5 radiates more radiation energy to the heat radiation coating layer 100 on the front of the chassis base 60.

Figure 5:
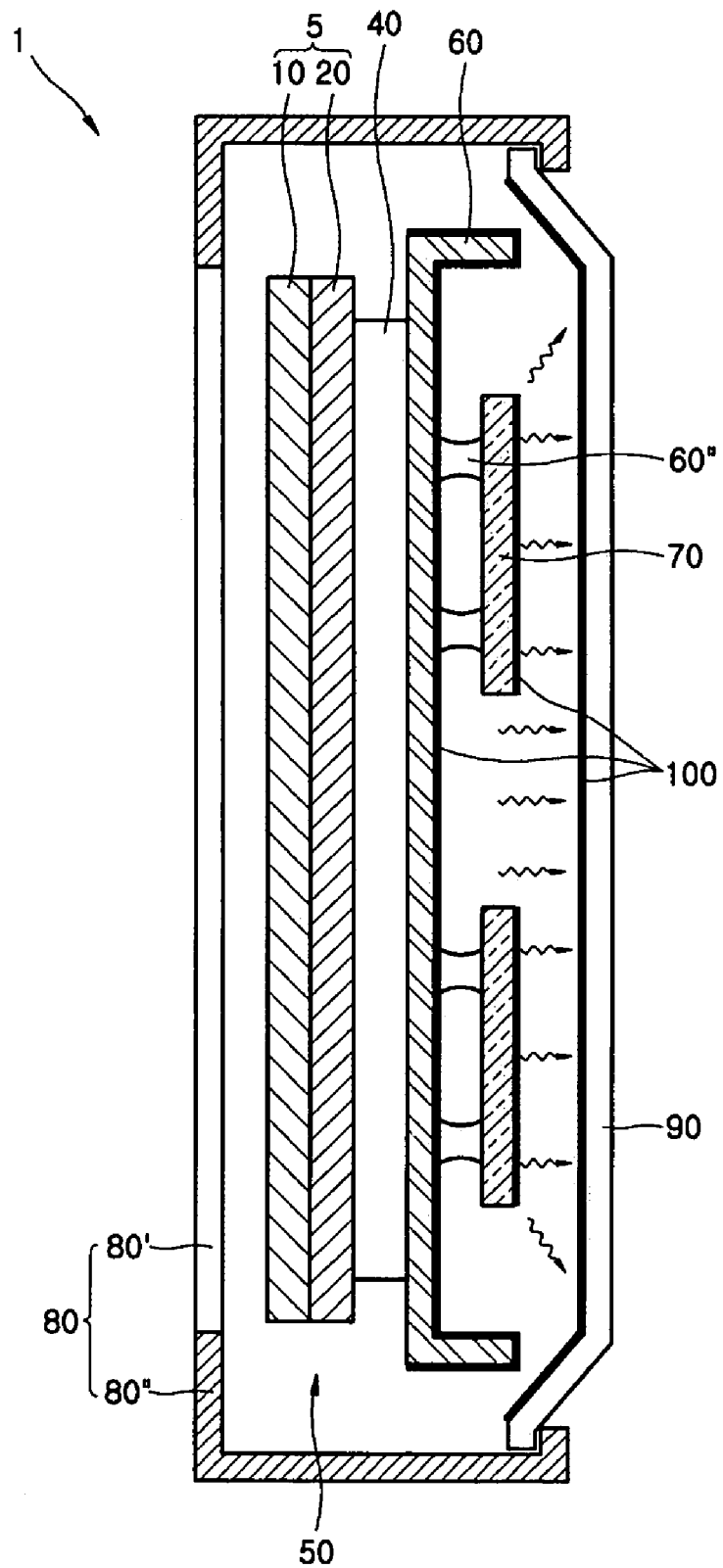

FIG. 5 is cross-sectional view of another plasma display device according to embodiment of the present invention.

Referring to FIG. 5, the heat radiation coating layer 100 may be disposed on a backside of the chassis base 60. Since circuit devices (not shown) mounted on a back side of the chassis base 60, generate a large amount of heat and heat generated by the plasma display panel 5 is also transferred to the chassis base 60, a large amount of heat may accumulate on the back side of the chassis base 60. The heat may be rapidly dissipated in the form of radiation energy, that is, far infrared rays by forming on the back side of the chassis base 60 a heat radiation coating layer 100 having high emissivity.

When promoting heat dissipation, performance of the plasma display panel 5 may be improved through lowering of temperature of the chassis base 60. Additionally, heat dissipation of the circuit devices mounted on the back side of the chassis base 60 may also be accomplished, thereby enabling stable operation of the plasma display device 1.

As depicted in FIG. 5, forming heat radiation coating layers 100 on the circuit unit 70 further promotes heat radiation from the circuit devices, and this enables reducing the size of or removing a heat sink attached on a back side of the circuit unit 70.

The heat energy radiated from the chassis base 60 needs to be quickly absorbed by the back cover 90 to improve heat dissipation efficiency of the plasma display device 1. For this purpose, as depicted in FIG. 5, a heat radiation coating layer 100 may be formed on a surface of the back cover 90 facing the chassis base 60. The heat radiation coating layer 100 may rapidly transfer heat to the back cover 90 formed of a thermal conductivity material, thereby rapidly dissipating heat accumulated in the chassis base 60 to the outside.

Figure 6:
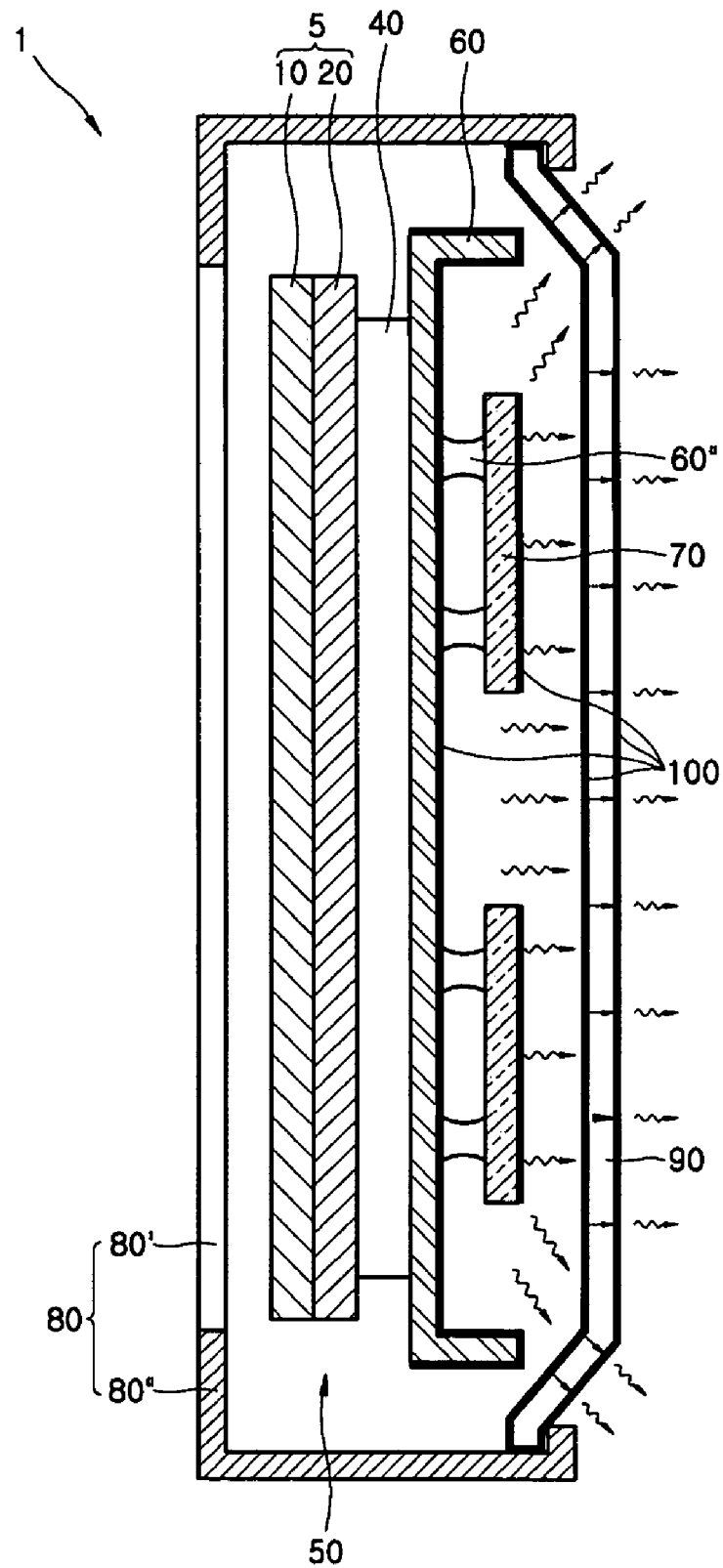

At the last stage of a heat transfer route, heat generated by the plasma display device 1 may be transferred to the back cover 90 and then dissipated to the outside. As depicted in FIG. 6, forming a heat radiation coating layer 100 on an external surface of the back cover 90, promotes heat radiation from the back cover 90 since heat dissipation can be made by both heat convection and heat radiation, thereby improving heat dissipation efficiency of the plasma display device 1.

According to the present invention, heat in the form of radiation may be transferred rapidly from the back side of the chassis base 60 to the back cover 90 by simply forming heat radiation coating layers 100 with high emissivity on the chassis base 60 and/or the back cover 90.

Since the emissivity of aluminum is about 0.03-0.3, if a heat radiation coating layer 100 formed of CERACα is attached to the chassis base 60 and the back cover 90 both formed of aluminum, the emissivity may be increased to about 0.96. Consequently, a high heat transfer efficiency may be achieved.

Efficient heat radiation may be achieved in a sealed space by protecting internal devices since heat transfer by radiation can be made in a sealed space. An additional heat dissipation device such as a cooling fan or a heat pipe may be unnecessary.

EXPERIMENT

Effect of the improved heat transfer may be proved from the following experiments. Following experiments were performed when the heat radiation coating layer 100 was formed of CERACα, a kind of liquid ceramic paint.

Figure 7:
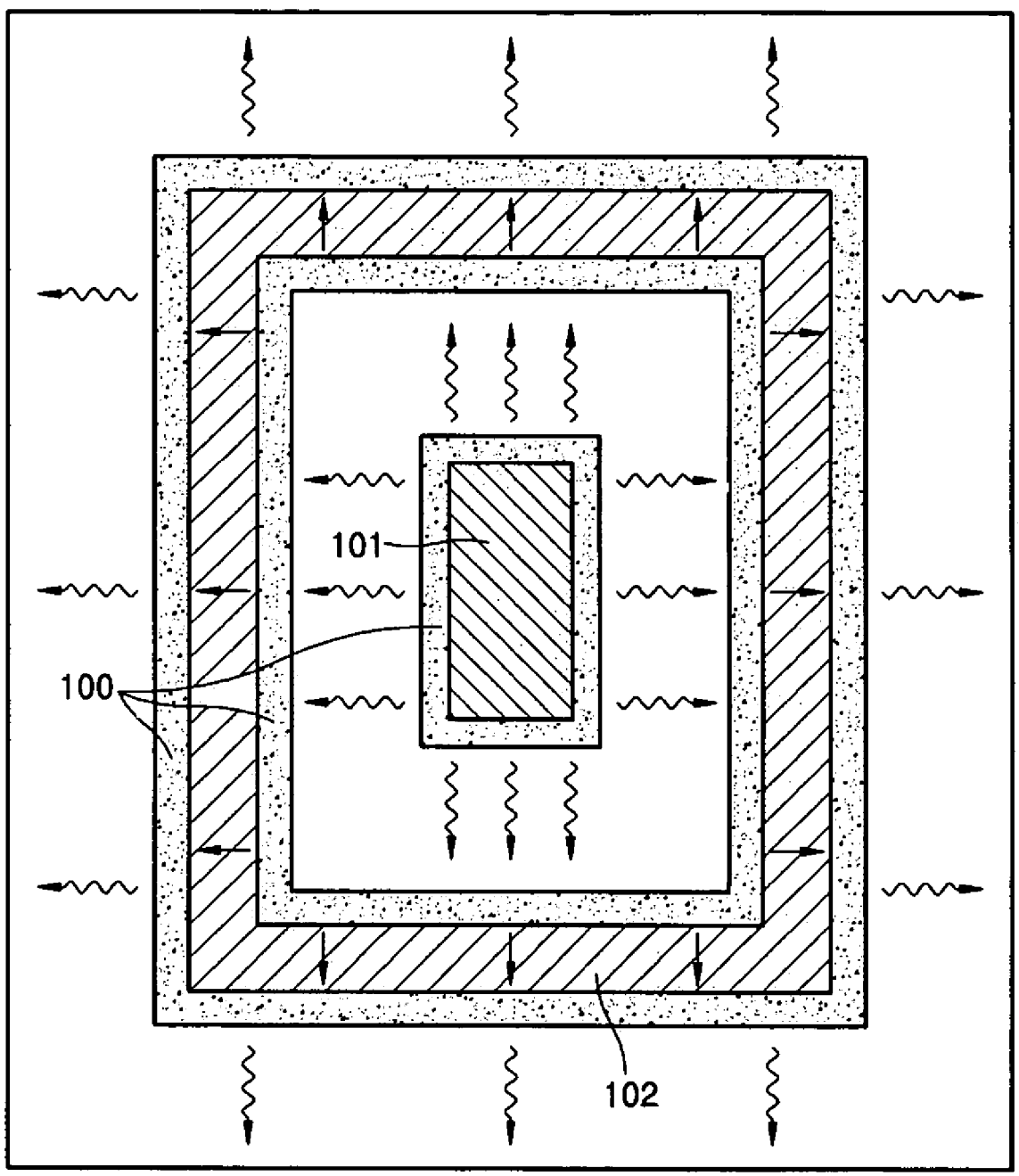
FIG. 7 is a schematic drawing showing an experiment apparatus for measuring heat radiation effect according to the present invention.

As depicted in FIG. 7, a heat generating unit 101 with dimensions of 40×40×16 mm was inserted to a box 102 formed of a aluminium plate with dimensions of 100×100× 100 mm and a thickness of 1 mm, and 8 W of power was applied to the heat generation unit 101. Then, temperatures of the heat generating unit 101, an inner side of the box 102, and a surface of the box 102 were measured.

Figure 8:
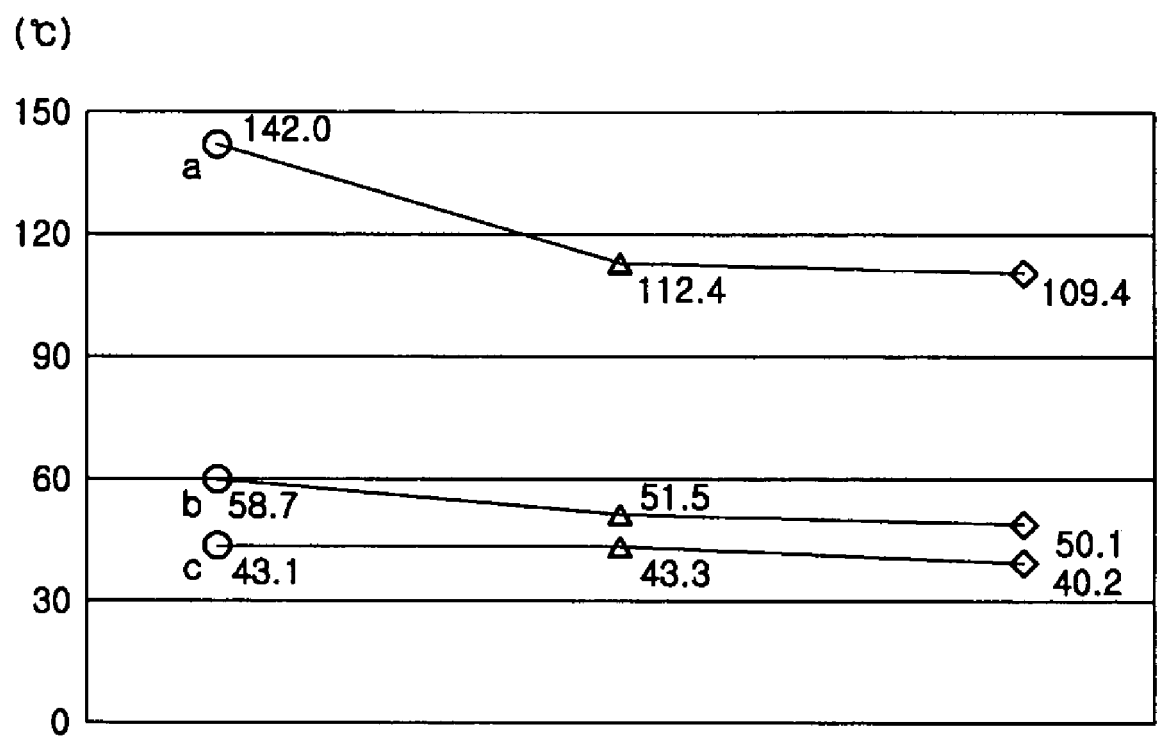
FIG. 8 is a graph showing test results measured using the experiment apparatus of FIG. 7.

To examine a degree of improvement by forming the heat radiation coating layer 100, temperatures of three cases, case without the heat radiation coating layer 100, case with the heat radiation coating layers 100 on inner surfaces of the box 102 and the heat generating unit 101, and case with heat radiation coating layers 100 on inner and outer surfaces of the box 102 and the heat generating unit 101, were measured, and the results are summarized in FIG. 8.

Reference symbols having circle, triangle, and diamond shapes respectively represent the case without the heat radiation coating layer 100, case with the heat radiation coating layers 100 on inner surfaces of the box 102 and heat generating unit 101, and case with the heat radiation coating layers 100 on inner and outer surfaces of the box 102 and heat generating unit 101.

Reference characteristics a, b, and c represent graphs of the temperature profile of the heat generating unit 101, the inner side of the box 102, and the surfaces of the box 102, respectively.

As depicted in FIG. 8, when heat radiation coating layers 100 were formed, the temperatures of the heat generating unit 101, the inner side of the box 102, and the box 102, are all reduced. Additionally, where the heat radiation coating layer 100 was formed on an outer surface of the box 102 (diamond symbol) resulted in a reduced temperature as compared to a case where the heat radiation coating layer 100 was not formed on the outer surface of the box 102(triangle symbol).

In a quantitative aspect, based on the temperature of the heat generating unit 101, the case with the heat radiation coating layer 100 on inner and outer surfaces of the box 102 and heat generating unit 101, shows about 20% improvement in heat dissipation effect compared to the case without the heat radiation coating layer 100.

These test results prove that when a heat radiation coating layer 100 is formed, the heat generated in the heat generating unit 101 is rapidly radiated to the box 102 in the form of radiation by the heat radiation coating layer 100, and that the radiated heat from the heat generating unit 101 is rapidly absorbed by the heat radiation coating layer 100 formed in the box 102.

Thus, forming a heat radiation coating layer 100 on the outer surface of the case 102, may rapidly dissipate heat to the outside in the form of radiated energy.

The plasma display panel and the plasma display device which includes the plasma display panel according to the present invention provides the following advantages.

First, when a heat radiation coating layer is formed on a back side of a plasma display panel, heat generated by the plasma display panel may be transferred to a chassis base through the heat radiation coating layer, thus rendering an additional heat dissipation sheet unnecessary. Therefore, time and costs for preparing the heat dissipation sheet may be reduced, and modification or maintenance of the display are simplified. Also, a slim and light plasma display device may be manufactured due to the reduced number of parts in the device.

Specifically, since the heat dissipation sheet is unnecessary, poor heat radiation caused by poor contact between the heat dissipation sheet and the plasma display panel, and between the heat dissipation sheet and the chassis base may be fundamentally removed.

Second, since heat transfer by radiation is not influenced by the contact tightness between the plasma display panel and the chassis base, tightness need not be considered when manufacturing the plasma display device, thereby improving workability.

Third, a temperature of the chassis base in which a large amount of heat is accumulated can be reduced by forming a heat radiation coating layer with high emissivity. Accordingly, heat dissipation of the circuit devices mounted on a back side of the chassis base is promoted, thereby enabling stable operation of the plasma display device. When a heat radiation coating layer is formed on the circuit substrate, on which circuits are mounted, heat radiation may be directly performed from the heat radiation coating layer, thereby improving heat transfer efficiency and reducing manufacturing cost since the heat sink may be removed entirely or greatly decreased in size.

Especially when a heat radiation coating layer is formed on the back cover, absorption of radiated energy from the chassis base may be promoted, thereby further improving heat transfer efficiency.

Fourth, when a high thermal conductivity heat radiation coating layer is formed on a back side of the plasma display panel, heat dissipation in the plane direction on the plasma display panel may be promoted, thereby improving uniformity of temperature distribution on the plasma display panel.

When there is a discharge strength difference between cells for expressing grey scale, this can cause uneven temperature distribution on the panel. However, according to the present invention, this uneven temperature distribution may be rapidly eased. Therefore, a latent image may be mitigated or removed, a crack of the plasma display panel which is formed of glass may be prevented, and durability of the plasma display device may be improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A plasma display device, comprising:
    a plasma display module that includes a plasma display panel on which an image is displayed, a chassis base disposed facing the plasma display panel, and a circuit unit disposed at a back side of the chassis base for driving the plasma display panel;
    a front cover and a back cover that house the plasma display module therebetween; and at least a heat radiation coating layer, including at least a ceramic material having emissivity of at least 0.9, and formed between the front cover and the back cover, a first surface of the heat radiation coating layer being adhered to a heating element, and a second surface of the heat radiation coating layer being separated from an adjacent element opposite to the heating element.

2. The plasma display device of claim 1, wherein the heat radiation coating layer includes alumina and silica.

3. The plasma display device of claim 1, wherein the heat radiation coating layer is formed by a coating of ceramic paint.

4. The plasma display device of claim 1, wherein the heat radiation coating layer is transparent for transmitting light and is formed on a surface of the plasma display panel facing the front cover.

5. The plasma display device of claim 1, wherein the heat radiation coating layer is formed on a surface of the plasma display panel facing the chassis base.

6. The plasma display device of claim 5, wherein the heat radiation coating layer is formed with a low brightness color for improving contrast.

7. The plasma display device of claim 1, wherein the heat radiation coating layer is formed on at least one surface of the chassis base.

8. The plasma display device of claim 1, wherein the heat radiation coating layer is formed on a surface of the circuit unit.

9. The plasma display device of claim 1, wherein the heat radiation coating layer is formed on at least one surface of the back cover.

10. The plasma display device of claim 1, wherein the heat radiation coating layer is formed on at least a surface of the front cover.

11. The plasma display device of claim 1, wherein the ceramic material comprises an oxide ceramic, a nitride ceramic, or Silicon Carbide (SiC).

12. A plasma display module, comprising:
a plasma display panel on which an image is displayed;
a chassis base facing the plasma display panel; and
at least a heat radiation coating layer, including at least a ceramic material, having emissivity of at least 0.9, and formed between the plasma display panel and the chassis base, a first surface of the heat radiation coating layer being adhered to a heating element, and a second surface of the heat radiation coating layer being separated from an adjacent element opposite to the heating element.

13. The plasma display module of claim 12, wherein the heat radiation coating layer is formed on at least a surface of the plasma display panel.

14. The plasma display module of claim 12, wherein the heat radiation coating layer is formed on at least one surface of the chassis base.

15. The plasma display module of claim 12, wherein the ceramic material comprises an oxide ceramic, a nitride ceramic, or Silicon Carbide (SiC).

16. A plasma display panel, comprising:
a front panel;
a rear panel combined with the front panel; and
at least a heat radiation coating layer, including at least a ceramic material, having emissivity of at least 0.9, and a first surface of the heat radiation coating layer being adhered to at least one of a front surface of the front panel and a back surface of the rear panel, a second surface of the heat radiation coating layer being separated from an adjacent element opposite to the front panel or the back panel.

17. The plasma display panel of claim 16, wherein the ceramic material comprises an oxide ceramic, a nitride ceramic, or Silicon Carbide (SiC).

* * * * *